US011037968B2

(12) United States Patent
Ion et al.

(10) Patent No.: US 11,037,968 B2
(45) Date of Patent: Jun. 15, 2021

(54) IMAGE SENSOR ARCHITECTURE

(71) Applicant: Waymo LLC, Mountain View, CA (US)

(72) Inventors: Lucian Ion, Santa Clara, CA (US); Vlad Constantin Cardei, Redwood City, CA (US); Carl Warren Craddock, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 62 days.

(21) Appl. No.: 16/376,634

(22) Filed: Apr. 5, 2019

(65) Prior Publication Data
US 2020/0321374 A1    Oct. 8, 2020

(51) Int. Cl.
*H01L 27/146* (2006.01)
*G06N 3/08* (2006.01)
(Continued)

(52) U.S. Cl.
CPC ...... *H01L 27/14605* (2013.01); *G06K 9/3233* (2013.01); *G06N 3/02* (2013.01);
(Continued)

(58) Field of Classification Search
CPC ............ G06N 3/02; G06N 3/04; G06N 3/067; G06N 3/0675; H01L 27/14603;
(Continued)

(56) References Cited

U.S. PATENT DOCUMENTS 5,324,678 A   6/1994  Kusunoki
6,894,265 B2  5/2005  Merrill et al.
(Continued)

FOREIGN PATENT DOCUMENTS

WO   WO 2016/095117   6/2016
WO   WO 2016/121523   8/2016

OTHER PUBLICATIONS

PCT International Search Report and Written Opinion in International Appln. No. PCT/US2020/025734, dated Jul. 20, 2020, 13 pages.
(Continued)

*Primary Examiner* — Matthew E Warren
(74) *Attorney, Agent, or Firm* — Fish & Richardson P.C.

(57) ABSTRACT

A image sensor includes a first integrated circuit layer including pixel sensors that are grouped based on position into pixel sensor groups, a second integrated circuit layer in electrical communication with the first integrated circuit layer, the second integrated circuit layer including image processing circuitry groups that are configured to each receive pixel information from a corresponding pixel sensor group, the image processing circuitry groups further configured to perform image processing operations on the pixel information to provide processed pixel information during operation of the image sensor, a third integrated circuit layer in electrical communication with the second integrated circuit layer, and the third integrated circuit layer including neural network circuitry groups that are configured to each receive the processed pixel information from a corresponding image processing circuitry group and perform analysis for object detection on the processed pixel information during operation of the image sensor.

15 Claims, 9 Drawing Sheets

(51) Int. Cl.
*G06K 9/32* (2006.01)
*H04N 5/232* (2006.01)
*H04N 5/341* (2011.01)
*G06N 3/067* (2006.01)
*G06N 3/02* (2006.01)
*G06N 3/04* (2006.01)

(52) U.S. Cl.
CPC ............... *G06N 3/04* (2013.01); *G06N 3/067* (2013.01); *G06N 3/0675* (2013.01); *G06N 3/08* (2013.01); *H01L 27/14609* (2013.01); *H01L 27/14634* (2013.01); *H04N 5/23229* (2013.01); *H04N 5/341* (2013.01); *H01L 2224/73261* (2013.01)

(58) Field of Classification Search
CPC ......... H01L 27/14605; H01L 27/14609; H01L 27/14634; H01L 2224/73261; G06K 9/3233; H04N 5/23229; H04N 5/341
USPC ......................................................... 257/291
See application file for complete search history.

(56) References Cited

U.S. PATENT DOCUMENTS

| | | | |
|---|---|---|---|
| 8,981,511 B2* | 3/2015 | Kinsman | H01L 27/14618 257/432 |
| 2003/0206236 A1 | 11/2003 | Levantovsky | |
| 2015/0146067 A1 | 5/2015 | Roh et al. | |
| 2016/0044266 A1* | 2/2016 | Oike | H04N 5/3741 348/308 |
| 2016/0267695 A1 | 9/2016 | Opdenbosch | |
| 2017/0083772 A1 | 3/2017 | Kim et al. | |
| 2017/0185871 A1 | 6/2017 | Zhang et al. | |
| 2018/0039882 A1* | 2/2018 | Ikeda | G06N 3/04 |
| 2018/0278868 A1* | 9/2018 | Dawson | G06N 3/0635 |
| 2018/0285715 A1 | 10/2018 | Son et al. | |
| 2019/0034748 A1* | 1/2019 | Matsumoto | G06N 3/0481 |
| 2019/0035154 A1* | 1/2019 | Liu | G06K 9/00208 |
| 2020/0195875 A1* | 6/2020 | Berkovich | H04N 5/23225 |

OTHER PUBLICATIONS

Shi et al., "An End-to-End Trainable Neural Network for Image-based Sequence Recognition and Its Application to Scene Text Recognition," https://arxiv.org/abs/1507.05717, Jul. 2015, 9 pages.
TW Office Action in Taiwan Appln. No. 109111283, dated Nov. 19, 2020, 28 pages (with English translation).

* cited by examiner

200

```
┌─────────────────────────────────────────────────────────────┐
│ OBTAIN, BY PIXEL SENSORS IN A FIRST INTEGRATED CIRCUIT LAYER│
│ AND THAT ARE GROUPED BASED ON POSITION INTO PIXEL SENSOR    │
│ GROUPS, PIXEL INFORMATION                                   │
│                                                         210 │
└─────────────────────────────────────────────────────────────┘
                              │
                              ▼
┌─────────────────────────────────────────────────────────────┐
│ PERFORM, BY IMAGE PROCESSING CIRCUITRY GROUPS IN A SECOND   │
│ INTEGRATED CIRCUIT LAYER, IMAGE PROCESSING OPERATIONS ON    │
│ THE PIXEL INFORMATION FROM A CORRESPONDING PIXEL SENSOR     │
│ GROUP TO PROVIDE PROCESSED PIXEL INFORMATION                │
│                                                         220 │
└─────────────────────────────────────────────────────────────┘
                              │
                              ▼
┌─────────────────────────────────────────────────────────────┐
│ PERFORM, BY NEURAL NETWORK CIRCUITRY GROUPS IN A THIRD      │
│ INTEGRATED CIRCUIT LAYER, ANALYSIS FOR OBJECT DETECTION ON  │
│ THE PROCESSED PIXEL INFORMATION FROM A CORRESPONDING        │
│ IMAGE PROCESSING CIRCUITRY GROUP                            │
│                                                         230 │
└─────────────────────────────────────────────────────────────┘
                              │
                              ▼
┌─────────────────────────────────────────────────────────────┐
│ OUTPUT INFORMATION THAT INDICATES RESULTS OF THE ANALYSIS   │
│ OBJECT DETECTION BY THE NEURAL NETWORK CIRCUITRY GROUPS     │
│                                                         240 │
└─────────────────────────────────────────────────────────────┘
```

- 610: FRAME A IMAGE TRANSFER | IDLE | FRAME B IMAGE TRANSFER
- 620: CAPTURE FRAME A | | CAPTURE FRAME B
- 630: 10MS | 90MS | 10MS | 90MS | IDLE

- 710: FRAME A IMAGE TRANSFER | TRANSFER NEURAL NETWORK (NN) OUTPUT DATA FOR FRAMES A-I | FRAME K IMAGE TRANSFER | TRANSFER NN OUTPUT DATA FOR FRAMES J-T
- 720: GENERATE FRAME A NN DATA | GENERATE FRAME B NN DATA | ... | GENERATE FRAME J NN DATA | GENERATE FRAME K NN DATA | GENERATE FRAME L NN DATA | ...
- 730: CAPTURE FRAME A | CAPTURE FRAME B | ... | CAPTURE FRAME J | CAPTURE FRAME K | CAPTURE FRAME L | ... | CAPTURE FRAME T
- 740: 10MS | 10MS | 10MS | 10MS | 10MS

IMAGE SENSOR ARCHITECTURE

BACKGROUND

This specification relates to image sensors and systems that include the image sensors.

SUMMARY

This specification describes technologies relating to an image sensor that captures images and performs processing on the image sensor to detect objects. The specification further describes data transmission protocols for transmitting data from the image sensor to a remote processor.

In general, one innovative aspect of the subject matter described in this specification can be embodied in an image sensor that includes a first integrated circuit layer including pixel sensors that are grouped based on position into pixel sensor groups, a second integrated circuit layer in electrical communication with the first integrated circuit layer, the second integrated circuit layer including image processing circuitry groups that are configured to each receive pixel information from a corresponding pixel sensor group, the image processing circuitry groups further configured to perform image processing operations on the pixel information to provide processed pixel information during operation of the image sensor, a third integrated circuit layer in electrical communication with the second integrated circuit layer, the third integrated circuit layer including neural network circuitry groups that are configured to each receive the processed pixel information from a corresponding image processing circuitry group, the neural network circuitry groups further configured to perform analysis for object detection on the processed pixel information during operation of the image sensor, and circuitry that outputs information indicating results of the analysis for object detection by the neural network circuitry groups, where the first integrated circuit layer is stacked on the second integrated circuit layer and the second integrated circuit layer is stacked on the third integrated circuit layer.

Other embodiments of this aspect include corresponding methods that perform actions corresponding to the image sensor and that perform actions to form the image sensor.

These and other embodiments can each optionally include one or more of the following features. In some aspects, the results of the analysis for object detection include at least one of the group consisting of selected regions of interest for pixels representing detections, metadata containing temporal and geometrical location information, intermediate computational results prior to object detection, statistical information regarding network certainty level, and classifications of detected objects. In certain aspects, the neural network circuitry groups each include circuitry that is configured to implement a convolutional neural network.

In some aspects, the convolutional neural networks each detect objects sensed by the pixel sensor group that corresponds to the image processing circuitry group that corresponds to the neural network circuitry group. In some implementations, the third integrated circuit layer includes circuitry that is configured to implement a recurrent neural network. In certain aspects, the recurrent neural network receives the information regarding the objects detected by all of the neural network circuitry groups and detects objects sensed across multiple ones of the pixel sensor groups.

In some aspects, each of the neural network circuitry groups is located directly beneath the image processing circuitry group that provides the processed pixel information to the neural network circuitry group. In certain aspects, each of the image processing circuitry groups is located directly beneath or in the immediate proximity of the pixel sensor group that provides the pixel information to the image processing circuitry group. In some implementations, the first integrated circuit layer, the second integrated circuit layer, and the third integrated circuit layer are integrated in a single integrated chip.

In some aspects, each of the pixel sensor groups include a same number of pixel sensors. In certain aspects, the image processing operations performed on the pixel information include high dynamic range fusion prior to processing. In some implementations, each of the image processing circuitry groups includes an analog digital converter. In general, one innovative aspect of the subject matter described in this specification can be embodied in a method that includes the actions of obtaining multiple images captured by pixel sensors of an image sensor, analyzing, using neural network circuitry integrated in the image sensor, the multiple images for object detection, generating, for each of the multiple images using the neural network circuitry integrated in the image sensor, neural network output data related to results of the analysis of the multiple images for object detection, and transmitting, from the image sensor, the neural network output data for each of the multiple images and image data for a subset of the multiple images instead of image data of each of the multiple images.

Other embodiments of this aspect include corresponding image sensors configured to perform the actions of the method.

These and other embodiments can each optionally include one or more of the following features. In some aspects, transmitting the neural network output data for each of the multiple images and image data for a subset of the multiple images instead of image data of each of the multiple images includes transmitting the image data for a first image in the multiple images and the neural network output data for the first image, transmitting the neural network output data for a second image, and transmitting the image data for a third image in the multiples images and the neural network output data for the third image before and without transmission of the image data for the second image.

In certain aspects, actions include analyzing the second image in the multiple images for object detection while transmitting the image data for the first image in the multiple images and the neural network output data for the first image. In some implementations, actions include generating the neural network output data related to results of the analysis of the multiple images for object detection while capturing the third image. In some aspects, transmitting, from the image sensor, the neural network output data for each of the multiple images and image data for a subset of the multiple images instead of image data of each of the multiple images includes transmitting the image data of the subset of the multiple images at a particular number of frames per second and transmitting the neural network output data for the images while the image data for the subset of the multiple images is not being transmitted.

In certain aspects, the subset of the multiple images comprises every Nth image captured by the image sensor, wherein N is an integer greater than one. In some implementations, the image data for a particular image of the images includes data that indicates values for each pixel within the image. In some aspects, the neural network output data for a particular image of the images includes one or more of selected regions of interest for pixels representing detections, metadata containing temporal and geometrical location information, intermediate computational results prior to object detection, statistical information regarding network certainty level, and classifications of detected objects.

In certain aspects, the neural network output data for a particular image of the images represents partially processed data that is provided to a processor for further processing. In some implementations, transmitting the neural network output data and the image data comprises transmitting the neural network output data and the image data to a central processing unit.

Particular embodiments of the subject matter described in this specification can be implemented so as to realize one or more of the following advantages. An advantage of this technology may be that the inclusion of multiple stacked integrated circuit layers in the image sensor may allow for processing to be distributed amongst the layers, which may allow for parallel processing by the layers and/or more processing to occur on the image sensor, as opposed to exclusively using processors remote from the image sensor in order to process the image data.

Performing additional processing with the layers of the image sensor instead of externally from the image sensor may remove the need to process certain data outside the image sensor, which may reduce the amount of bandwidth used to output information from the image sensor. For example, only a subset of frames captured by the image sensor may need to be output as some processing on the image sensor may already be done for the frames. Another advantage may be that the multiple layers may be arranged so that information may be transferred a short distance between the layers, which may allow for faster transmission of data.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is a flowchart of an example process for detection of an object with three integrated circuit layers of an image sensor.

FIG. 6 is a diagram of timing for an example image sensor without neural network circuitry.

FIG. 7 is a diagram of timing for an example image sensor with neural network circuitry.

Like reference numbers and designations in the various drawings indicate like elements.

DETAILED DESCRIPTION

Figure 1:
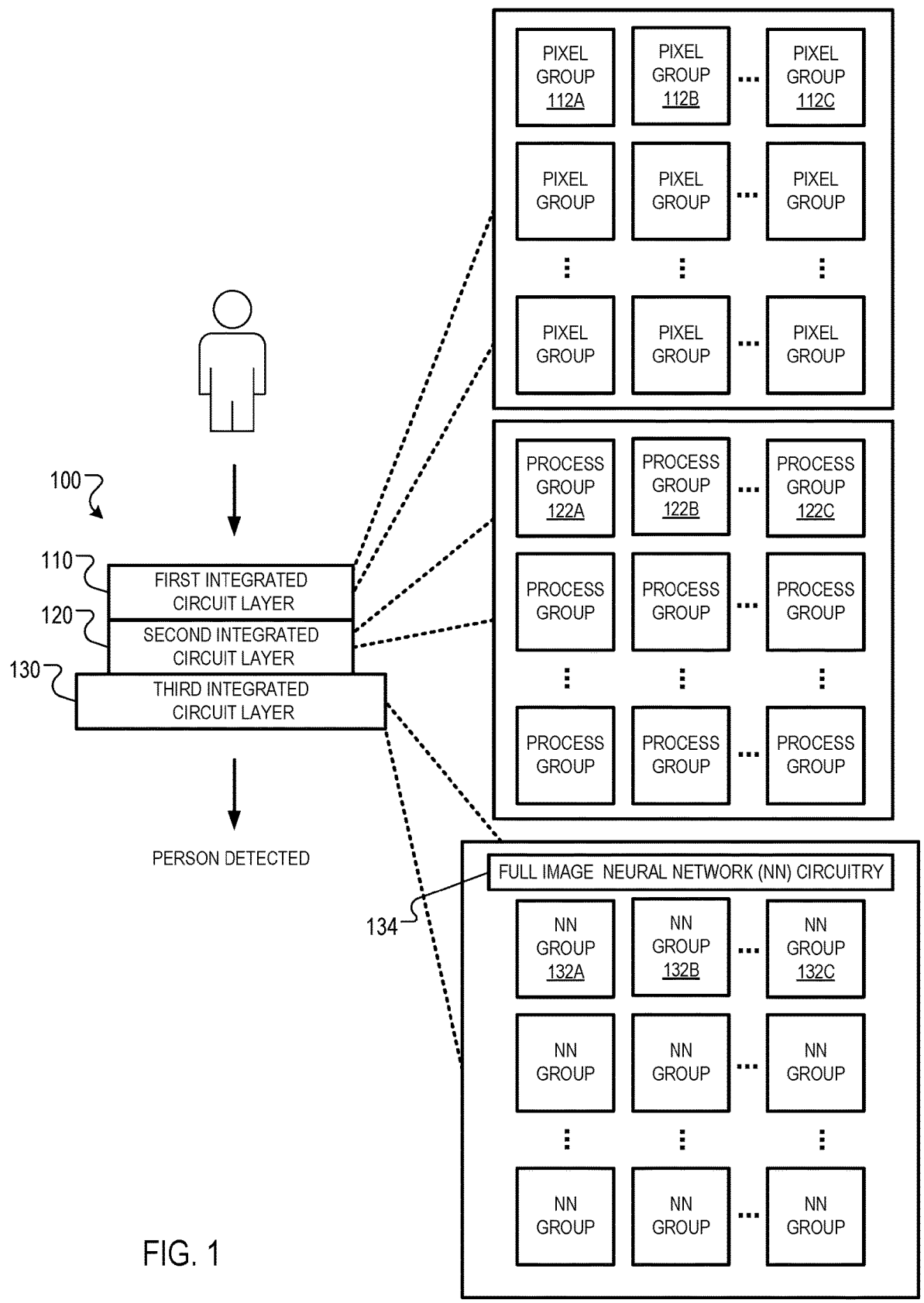
FIG. 1 is a block diagram of an example image sensor with three integrated circuit layers.

FIG. 1 is a block diagram of an example image sensor 100 with three integrated circuit layers. The image sensor 100 may use the three integrated circuit layers to detect objects. For example, the image sensor 100 may capture an image that includes a person and output an indication of "person detected." In another example, the image sensor 100 may capture an image and output a portion of the image that includes a vehicle that was detected by the image sensor 100.

The three integrated circuit layers includes a first integrated circuit layer 110, a second integrated circuit layer 120, and a third integrated circuit layer 130. The first integrated circuit layer 110 is stacked on the second integrated circuit layer 120, and the second integrated circuit layer 120 is stacked on the third integrated circuit layer 130. For example, the first integrated circuit layer 110 is in direct contact with the top of the second integrated circuit layer 120 and the third integrated circuit layer 130 is in direct contact with the bottom of the second integrated circuit layer 120.

The first integrated circuit layer 110 may be in electrical communication with the second integrated circuit layer 120. For example, the first integrated circuit layer 110 and the second integrated circuit layer 120 may be physically connected to one another with interconnects. The second integrated circuit layer 120 may be in electrical communication with third integrated circuit layer 130. For example, the second integrated circuit layer 120 and the third integrated circuit layer 130 may be physically connected to one another with interconnects.

The first integrated circuit layer 110 may have a same area as the second integrated circuit layer 120. For example, the length and width of the first integrated circuit layer 110 and the second integrated circuit layer 120 may be the same while the heights may be different. The third integrated circuit layer 130 may have a larger area than the first and second integrated circuit layers 110, 120. For example, the third integrated circuit layer 130 may have a length and width that are both twenty percent greater than the length and the width of the first and second integrated circuit layers 110, 120.

The first integrated circuit layer 110 may include an array of pixel sensors that are grouped by position into pixel sensor groups (each pixel sensor group referred to as "pixel group" in FIG. 1) 112A-112C (collectively referred to by 112). For example, the first integrated circuit layer 110 may include a 6400×4800 array of pixel sensors grouped into three hundred twenty by two hundred forty pixel sensor groups, where each pixel sensor group includes an array of 20×20 pixel sensors.

Each of the pixel sensor groups 112 may include 2×2 pixel sensor sub-groups. For example, each of the pixel sensor groups of 20×20 pixel sensors may include ten by ten pixel sensor sub-groups, where each pixel sensor sub-group includes a red pixel sensor in an upper left, a green pixel sensor in a lower right, a first clear pixel sensor in a lower left, and a second clear pixel sensor in an upper right, each sub-group also referred to as Red-Clear-Clear-Green (RCCG) sub-groups.

In some implementations, the size of the pixel sensor groups may be selected to increase silicon utilization. For example, the size of the pixel sensor groups may be such that more of the silicon is covered by pixel sensor groups with the same pattern of pixel sensors.

The second integrated circuit layer 120 may include image processing circuitry groups (each image processing circuitry group referred to as "process group" in FIG. 1) 122A-122C (collectively referred to by 122). For example, the second integrated circuit layer 120 may include three hundred twenty by two hundred forty image processing circuitry groups.

The image processing circuitry groups 122 may be configured to each receive pixel information from a corresponding pixel sensor group and further configured to perform image processing operations on the pixel information to provide processed pixel information during operation of the image sensor 100.

In some implementations, each image processing circuitry group 122 may receive pixel information from a single corresponding pixel sensor group 112. For example, image processing circuitry group 122A may receive pixel information from pixel sensor group 112A and not from any other pixel group, and image circuitry processing group 122B may receive pixel information from pixel sensor group 112B and not from any other pixel group.

In some implementations, each image processing circuitry group 122 may receive pixel information from multiple corresponding pixel sensor groups 112. For example, the image processing circuitry group 122A may receive pixel information from both pixel sensor groups 112A and 112B and no other pixel groups, and image processing circuitry group 122B may receive pixel information from pixel group 112C and another pixel group, and no other pixel groups.

Having the image processing circuitry groups 122 receive pixel information from corresponding pixel groups may result in fast transfer of the pixel information from the first integrated circuit layer 110 to the second layer 120 as the image processing circuitry groups 122 may physically be close to the corresponding pixel sensor groups 112. The further distance that information is transferred the longer the transfer may take. For example, the pixel sensor group 112A may be directly above the image processing circuitry group 122A and the pixel sensor group 112A may not be directly above the image processing circuitry group 122C, so transferring pixel information from the pixel sensor group 112A to the image processing circuitry group 122A may be faster than transferring pixel information from the pixel sensor group 112A to the image processing circuitry group 122C, if there were interconnects between the pixel sensor group 112A and the image processing circuitry group 122C.

The image processing circuitry groups 122 may be configured to perform image processing operations on pixel information that the image processing circuitry groups 122 receives from the pixel groups. For example, the image processing circuitry group 122A may perform high dynamic range fusion on pixel information from pixel sensor group 112A and the image processing circuitry group 122B may perform high dynamic range fusion on pixel information from pixel sensor group 112B. Other image processing operations may include, for example, analog to digital signal conversion and de-mosaicing.

Having the image processing circuitry groups 122 perform image processing operations on pixel information from corresponding pixel sensor groups 112 may enable image processing operations to be performed in a distributed fashion in parallel by the image processing circuitry groups 122. For example, image processing circuitry group 122A may perform image processing operations on pixel information from pixel sensor group 112A at the same time as image processing circuitry group 122B performs image processing operations on pixel information from pixel group 122B.

The third integrated circuit layer 130 may include neural network circuitry groups 132A-132C (each neural network circuitry group referred to as "NN group" in FIG. 1) 132A-132C (collectively referred to by 132) and full image neural network circuitry 134. For example, the third integrated circuit layer 130 may include three hundred twenty by two hundred forty neural network circuitry groups.

The neural network circuitry groups 132 may be configured to each receive processed pixel information from a corresponding image processing circuitry group and further configured to perform analysis for object detection on the processed pixel information during operation of the image sensor 100. In some implementations, the neural network circuitry groups 132 may each implement a convolutional neural network (CNN).

In some implementations, each neural network circuitry group 132 may receive processed pixel information from a single corresponding image processing circuitry group 122. For example, neural network circuitry group 132A may receive processed pixel information from image processing circuitry group 122A and not from any other image processing circuitry group, and neural network circuitry group 132B may receive processed pixel information from image processing circuitry group 122B and not from any other image processing circuitry group.

In some implementations, each neural network circuitry group 132 may receive processed pixel information from multiple corresponding image processing circuitry groups 122. For example, the neural network circuitry group 132A may receive processed pixel information from both image processing circuitry groups 122A and 122B and no other image processing circuitry groups, and neural network circuitry group 132B may receive processed pixel information from both image processing circuitry group 122C and another pixel group, and no other pixel groups.

Having the neural network circuitry groups 132 receive processed pixel information from corresponding image processing circuitry groups may result in fast transfer of the processed pixel information from the second integrated circuit layer 120 to the third integrated circuit layer 130 as the neural network circuitry groups 132 may physically be close to the corresponding image processing circuitry groups 122. The further distance that information is transferred the longer the transfer may take. For example, image processing circuitry group 122A may be directly above neural network circuitry group 132A so transferring processed pixel information from image processing circuitry group 122A to neural network circuitry group 132A may be faster than transferring processed pixel information from image processing circuitry group 122A to neural network circuitry group 132C, if there were interconnects between the image processing circuitry group 122A and the neural network circuitry group 132C.

The neural network circuitry groups 132 may be configured to detect objects from the processed pixel information that the neural network circuitry groups 132 receive from the image processing circuitry groups 122. For example, the neural network circuitry group 132A may detect objects from the processed pixel information from image processing circuitry group 122A, and the neural network circuitry group 132B may detect objects from the processed pixel information from image processing circuitry group 122B.

Having the neural network circuitry groups 132 detect objects from the processed pixel information from corresponding image processing circuitry group 122 enables detection to be performed in a distributed fashion in parallel by each of the neural network circuitry groups 132. For example, neural network circuitry group 132A may detect objects from processed pixel information from image processing circuitry group 122A at the same time as neural network circuitry group 132B may detect objects from processed pixel information from image processing circuitry group 122B.

In some implementations, the neural network circuitry groups 132 may perform intermediate processing. Accordingly, the image sensor 100 may use the three integrated circuit layers 110, 120, and 130 to perform some intermediate processing and output just an intermediate result. For example, the image sensor 100 may capture an image that includes a person and output an indication of "area of interest in some region of the image", without classifying the object of interest (the person). Other processing, performed outside the image sensor 100 may classify the region of interest as a person.

Accordingly, the output from the image sensor 100 may include some data representing the output of some convolutional neural network. This data in itself may be hard to decipher, but once it continues to be processed outside the image sensor 100, the data may be used to classify the region as including a person. This hybrid approach may have an advantage of reducing required bandwidth. Accordingly, output from the neural network circuitry groups 132 may include one or more of selected regions of interest for pixels representing detections, metadata containing temporal and geometrical location information, intermediate computational results prior to object detection, statistical information regarding network certainty level, and classifications of detected objects.

In some implementations, the neural network circuitry groups 132 may be configured to implement CNNs with high recall and low precisions. The neural network circuitry groups 132 may each output a list of objects detected, where the object was detected, and timing of detection of the object.

The full image neural network circuitry 134 may be configured to receive, from each of the neural network circuitry groups 132, data that indicates objects that the neural network circuitry groups 132 detected and detect objects from the data. For example, the neural network circuitry groups 132 may be unable to detect objects that are captured by multiple pixel groups as each individual neural network circuitry group may only receive a portion of processed pixel information corresponding to the object, but the full image neural network circuitry 134 may receive data from multiple neural network circuitry groups 132 so be able to detect objects sensed by multiple pixel groups. In some implementations, the full image neural network circuitry 134 may implement a recurrent neural network (RNN). The neural networks may be configurable, both in regard to their architecture (number and type of layers, activation functions, etc.) as well as in regard to the actual values of neural network components (e.g. weights, biases, etc.)

In some implementations, having the image sensor 100 perform processing may simplify a processing pipeline architecture, provide higher bandwidth and lower latency, allow for selective frame rate operations, reduce costs with the stacked architecture, provide higher system reliability as an integrated circuit may have fewer potential points of failure, and provide significant cost and power savings on computational resources.

In some implementations, the third integrated circuit layer 130 may be bonded to the second integrated circuit layer 120 using a silicon to silicon direct bonding method or a "flip chip" approach where a substrate is interposed between layers and connections are implemented using wire bonding from silicon to substrate.

FIG. 2 is a flowchart of an example process 200 for detection of an object with three integrated circuit layers of an image sensor. The process 200 may be performed by the image sensor 100 of FIG. 1, or some other image sensor.

The process 200 may include obtaining, by pixel sensors in a first integrated circuit layer and that are grouped based on position into pixel sensor groups, pixel information (210). For example, each of the pixel sensors in the pixel sensor groups 112 in the first integrated circuit layer 110 may generate pixel information that are analog signals that represent an intensity of light sensed by the pixel sensor. In some implementations, each of the pixel sensor groups includes a same number of pixel sensors. For example, each of the pixel sensor groups 112 may include four hundred pixel sensors that form twenty by twenty RCCG sub-groups.

The process 200 may include performing, by image processing circuitry groups in a second integrated circuit layer, image processing operations on the pixel information from a corresponding pixel sensor group to provide processed pixel information (220). For example, the image processing circuitry group 122A may receive pixel information from the pixel sensor group 112A and perform image processing operations on the pixel information from the pixel sensor group 112A while the image processing circuitry group 122B receives pixel information from the pixel sensor group 112B and performs image processing operations on the pixel information from the pixel sensor group 112B.

In some implementations, each of the image processing circuitry groups is located directly beneath the pixel sensor group that provides the pixel information to the image processing circuitry group. For example, the image processing circuitry group 122A may be located directly beneath the pixel sensor group 112A and the image processing circuitry group 122B may be located directly beneath the pixel sensor group 112B. In some implementations, each of the image processing circuitry groups may be located in the immediate proximity of the pixel sensor group that provides the pixel information to the image processing circuitry group. In some implementations, the second integrated circuit layer may be in electrical communication with the first integrated circuit layer. For example, the second integrated circuit layer 120 may be connected to the first integrated circuit layer 110 by interconnects formed of electrically conductive material.

The process 200 may include performing, by neural network circuitry groups in a third integrated circuit layer, analysis for object detection on the processed pixel information from a corresponding image processing circuitry group (230). For example, the neural network circuitry group 132A may receive processed pixel information from image processing circuitry group 122A and detect objects from the processed pixel information from the image processing circuitry group 122A, while the neural network circuitry group 132B receives pixel information from the image processing circuitry group 122B and detects objects from the processed pixel information from the image processing circuitry group 122B. In another example, the neural network circuitry groups 132 may receive processed pixel information from corresponding image processing circuitry groups 122 and output one or more of selected regions of interest for pixels representing detections, metadata containing temporal and geometrical location information, intermediate computational results prior to object detection, statistical information regarding network certainty level, and classifications of detected objects.

In some implementations, the neural network circuitry groups each include circuitry that is configured to implement a CNN. For example, the neural network circuitry group 132A may include circuitry for implementing a first CNN and the neural network circuitry group 132B may include circuitry for implementing a second, different CNN.

The convolutional neural networks may each detect objects sensed by the pixel sensor group that corresponds to the image processing circuitry group that corresponds to the neural network circuitry group. For example, the CNN of the neural network circuitry group 132A may detect a first object captured by pixel sensors in the pixel sensor group 112A and the CNN of the neural network circuitry group 132B may detect a second object captured by pixel sensors in the pixel sensor group 112B.

In some implementations, the third integrated circuit layer includes circuitry that is configured to implement a RNN. For example, the third integrated circuit layer 130 may include circuitry configured for a RNN that receives information regarding the objects detected by all of the neural network circuitry groups and detects objects sensed across multiple ones of the pixel sensor groups.

In some implementations, each of the neural network circuitry groups is located directly beneath the image processing circuitry group that provides the processed pixel information to the neural network circuitry group. For example, the neural network circuitry group 132A may be located directly beneath the image processing circuitry group 122A and the neural network circuitry group 132B may be located directly beneath the image processing circuitry group 122B.

In some implementations, the third integrated circuit layer may be in electrical communication with the second integrated circuit layer. For example, the third integrated circuit layer 130 may be connected to the second integrated circuit layer 120 by interconnects formed of electrically conductive material.

The process 200 may include outputting information that indicates results of the analysis for object detection by the neural network circuitry groups (240). For example, the third integrated circuit layer 130 may include circuitry configured to output metadata from the image sensor 100 to a central processing unit external to the image sensor 100, where the metadata specifies objects detected by the neural network circuitry groups 132.

In some implementations, the process 200 may be performed where the first integrated circuit layer is stacked on the second integrated circuit layer and the second integrated circuit layer is stacked on the third integrated circuit layer. For example, the process 200 may be performed by an image sensor 100 where a bottom of the first integrated circuit layer 110 is directly contacting a top of the second integrated circuit layer 120 and a bottom of the second integrated circuit layer 120 is directly contacting a top of the third integrated circuit layer 130.

In some implementations, the process 200 may be performed where the first integrated circuit layer, the second integrated circuit layer, and the third integrated circuit layer are integrated in a single integrated chip. For example, the process 200 may be performed by an image sensor 100 that is a single integrated chip.

Figure 3:
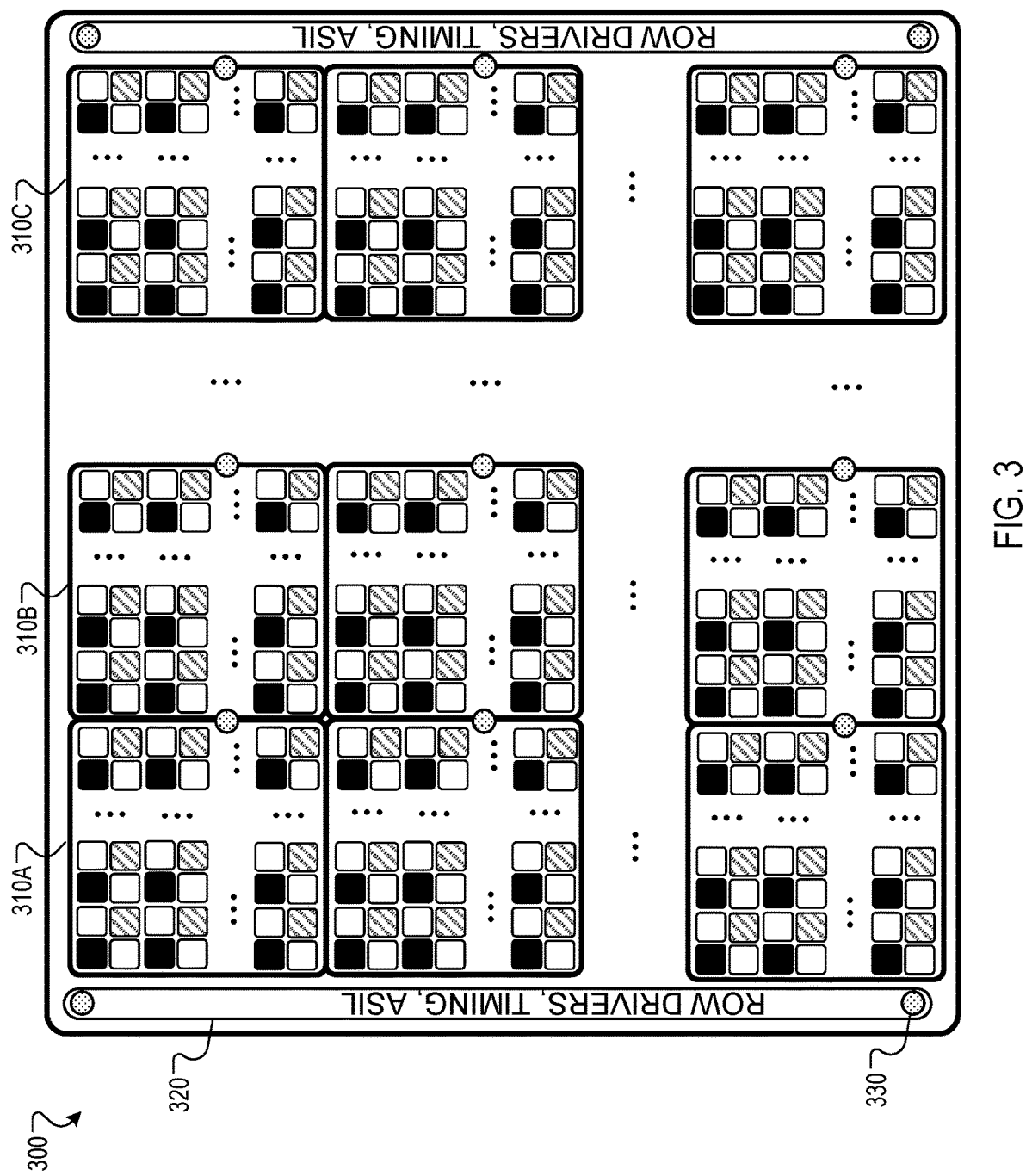
FIG. 3 is a block diagram of an example integrated circuit layer with pixel sensor groups.

FIG. 3 is a block diagram of an example integrated circuit layer 300 with pixel sensor groups. In some implementations, the integrated circuit layer 300 may be the first integrated circuit layer 110 shown in FIG. 1. The integrated circuit layer 300 includes pixel sensor groups 310, circuitry for row drivers, timing, and automotive safety integrity level 320, and interconnects 330. As shown in FIG. 3, the pixel sensor groups 310 each include multiple two by two arrays of RCCG sub-groups, and each of the pixel sensor groups 310 includes a same number of two by two arrays of RCCG sub-groups. However, other implementations of the integrated circuit layer 300 may include different pixel sensor groups. For example, each pixel group might include three by three arrays of RCCG sub-groups.

Figure 4:
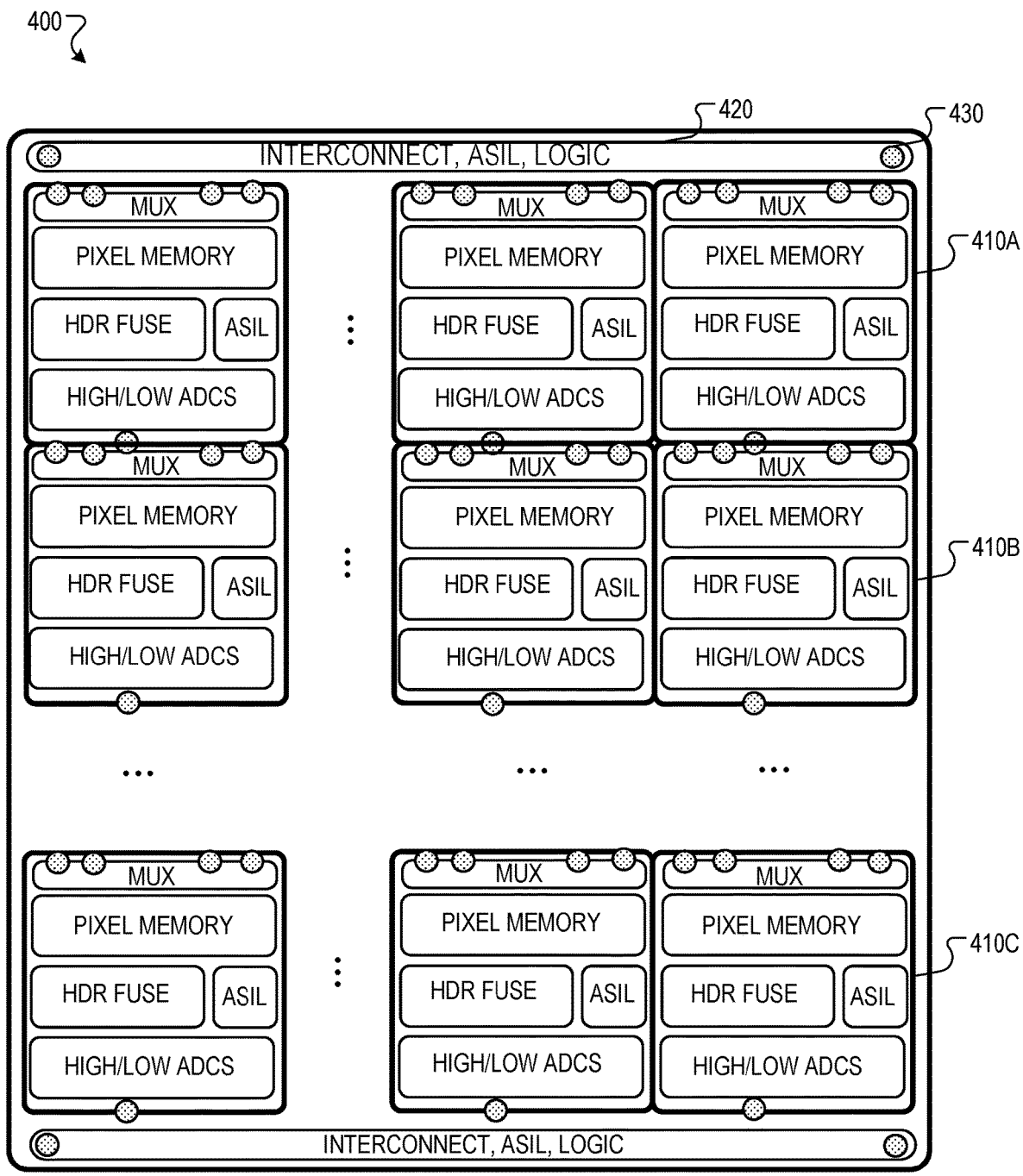
FIG. 4 is a block diagram of an example integrated circuit layer with image processing circuitry groups.

FIG. 4 is a block diagram of an example integrated circuit layer 400 with image processing circuitry groups. In some implementations, the integrated circuit layer 400 may be the second integrated circuit layer 120 shown in FIG. 1. The integrated circuit layer 400 may include image processing circuitry groups 410, circuitry for logic and automotive safety integrity level 420, and interconnects 430. As shown in FIG. 3, each of the image processing circuitry groups 410 may include circuitry for high/low analog-to-digital converters (ADCS), circuitry for high dynamic range fusion, circuitry for automotive safety integrity level, circuitry for pixel memory, and circuitry for a multiplexor. The multiplexor may allow flexibility in routing the information between layers as single pixel (multiple bits per pixel) or groups of pixels serialized on a single link (connection) towards the integrated circuit layer 500 with neural network circuitry group. Each of the image processing circuitry groups 410 may cover a same area as the pixel sensor group 310 that provides pixel information to the image processing circuitry group 410.

Figure 5:
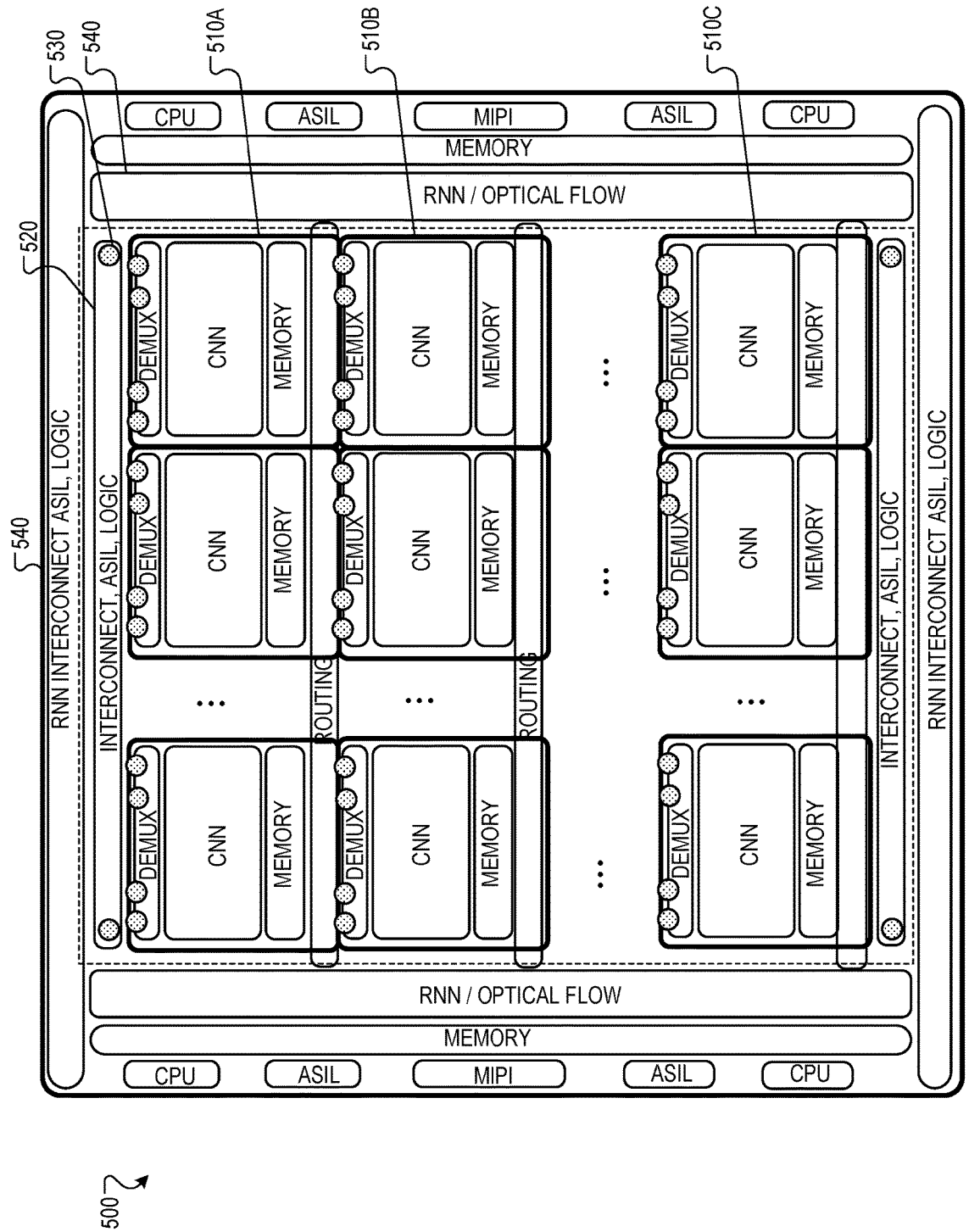
FIG. 5 is a block diagram of an example integrated circuit layer with neural network circuitry groups.

FIG. 5 is a block diagram of an example integrated circuit layer 500 with neural network circuitry groups. In some implementations, the integrated circuit layer 500 may be the third integrated circuit layer 130 shown in FIG. 1. The integrated circuit layer 400 may include neural network circuitry groups 510, circuitry for logic and automotive safety integrity level 520, interconnects 530, and a RNN.

As shown in FIG. 5, each of the neural network circuitry groups 510 may include circuitry for memory, a CNN, and a de-multiplexor. The de-multiplexor may deserialize the bits and pixels to restore the pixel configuration as captured. Each of the neural network circuitry groups 510 may cover a same area as the image processing circuitry group 410 that provides processed pixel information to the neural network circuitry group 410.

FIG. 6 is a diagram 600 of timing for an example image sensor without neural network circuitry. The diagram 600 may include a first row 610 that represents timing of transferring of frames, a second row 620 that represents timing of capturing of frames, and a third row 630 that indicates example timeframes related to the above actions.

The diagram 600 shows how a frame, also referred to as image, may be captured by an image sensor every one hundred milliseconds for ten milliseconds and the transferred frame is then transferred for twenty milliseconds. The image sensor may be idle for a remaining eighty milliseconds of the one hundred milliseconds. The image sensor may only transfers a single image every one hundred milliseconds as processing on the frame is done externally to the image sensor and takes eighty milliseconds per frame. For example, object detection on a full image by a central processing unit external to the image sensor may take eighty milliseconds. Accordingly, diagram 600 may show how only a single frame is used every one hundred milliseconds.

FIG. 7 is a diagram 700 of timing for an example image sensor with neural network circuitry. For example, the diagram 700 may show timing for the image sensor 100 of FIG. 1.

The diagram 700 may include includes a first row 710 that represents timing of transferring of frames, a second row 720 that represents timing of generating neural network output data related to detected objects within frames, a third row 730 that represents timing of capturing the frames, and a fourth row 740 that indicates example timeframes related to the above actions.

The diagram 700 may show how frames are captured by the image sensor every ten milliseconds, where every hundred milliseconds the image sensor transfers a frame for twenty milliseconds and neural network output data generated for ten frames captured by the image sensor is transferred for the remaining eighty milliseconds. Accordingly, the image sensor may provide information for ten times as many frames as in diagram 600, as while only image data for a single frame is still transferred per one hundred milliseconds, in diagram 700, neural network output data for ten frames is also provided every one hundred milliseconds.

As the neural network output data from the image sensor may already indicate whether objects were detected in the frame and other frames, having the image sensor transfer a frame for further processing along with neural network output data may result in less processing external to the image sensor.

As shown in diagram 700, neural network output data for a frame is generated once a frame is captured. For example, once frame A is captured, neural network output data may then be generated from frame A. In another example, once frame B is captured, neural network output data may then be generated from frame B.

The neural network output data for a frame is generated while another frame is being captured. For example, frame B may be captured while neural network output data for frame A is generated. Using the image sensor 100, the first integrated circuit layer 110 captures frame B while the third integrated circuit layer 130 detects objects and generates neural network output data that indicates the objects detected.

As shown in diagram 700, neural network output data for a frame is transferred after it is generated. For example, the neural network output data from frame A may be transferred once it is generated and once frame A has finished being transferred. In some implementations, transfer of the neural network output data may start once a group is done processing. This may be effective for rolling shutter sensors.

In some implementations, in regards to transmission, the image sensor 100 may also multiplex image grayscale or color data with neural network output data. For example, full image grayscale or color data with pre-processed object and temporal information may be multiplexed into a single data stream. Multiplexed data streams may have much lower output bandwidth requirements, e.g., more than four times less, than full image stream information. Multiplexing to have a single serial link of multiplexed information as camera output instead of multiple links may greatly simplify vehicle level architecture as the number of physical links may be reduced.

Figure 8:
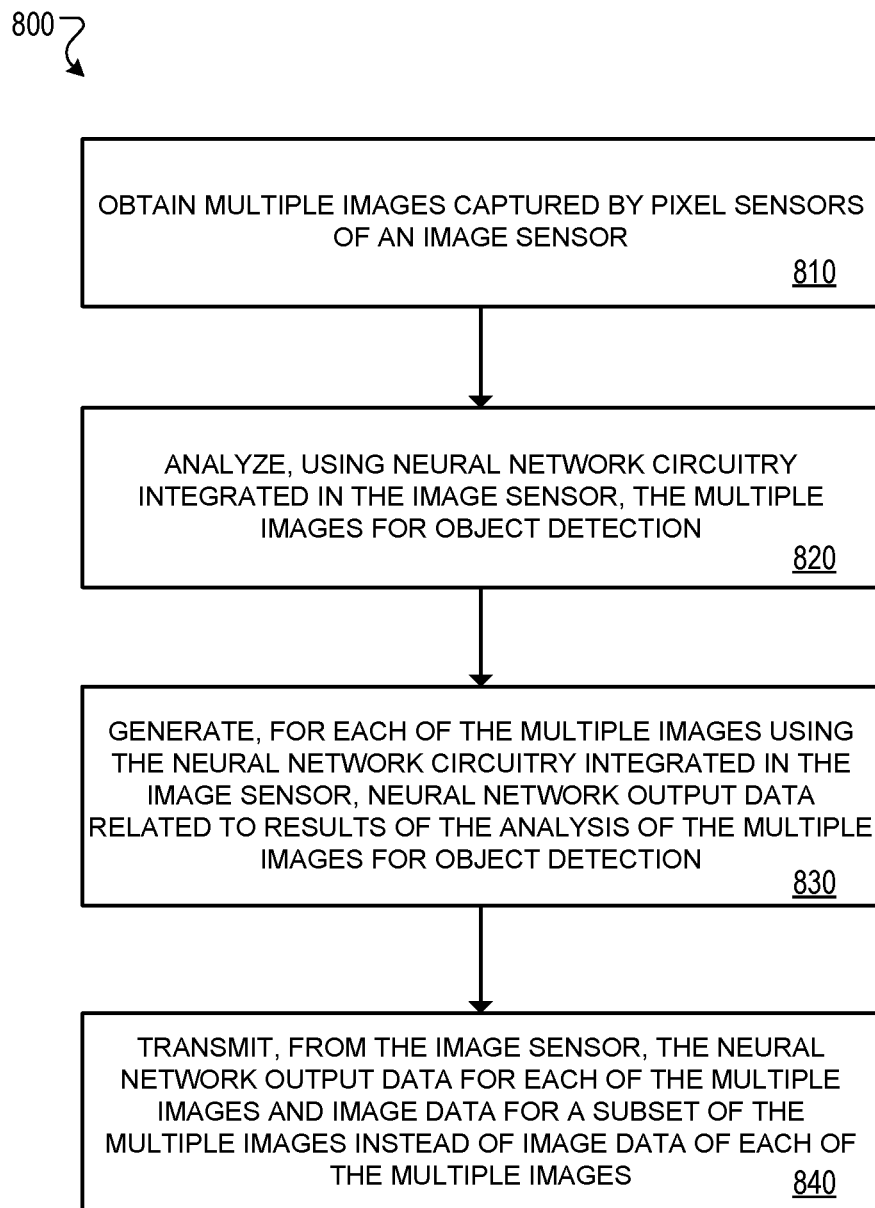
FIG. 8 is a flowchart of an example process for transmitting neural network output data and image data from an image sensor with neural network circuitry.

FIG. 8 is a flowchart of an example process 800 for transmitting neural network output data and image data from an image sensor with neural network circuitry. The process 800 may be performed by the image sensor 100 of FIG. 1 or some other image sensor.

The process 800 may include obtaining multiple images captured by pixel sensors of an image sensor (810). For example, the pixel sensors of the pixel groups 112C in the first integrated circuit layer 110 of the image sensor 100 may capture a different frame every ten milliseconds.

The process 800 may include analyzing, using neural network circuitry integrated in the image sensor, the multiple images for object detection (820). For the example, the neural network circuitry groups 132 in the third integrated circuit layer 130 of the image sensor 100 may detect objects within each of the portions of the frame for which the neural network circuitry group received processed pixel information.

The process 800 may include generating, for each of the multiple images using the neural network circuitry integrated in the image sensor, neural network output data related to results of the analysis of the multiple images for object detection (830). For example, a first neural network circuitry group 132A may generate metadata that indicates a first object was detected in a portion of frame A and a second neural network circuitry group 132B may generate metadata that indicates no object was detected in another portion of frame A.

The process 800 may include transmitting, from the image sensor, the neural network output data for each of the multiple images and image data for a subset of the multiple images instead of image data of each of the multiple images (840). For example, the image sensor 100 may transmit data that corresponds to the metadata generated by each of the neural network circuitry groups that indicates whether the neural network circuitry group detected objects in respective portions of each of the frames captured by the image sensor 100, and image data of only every tenth frame captured by the image sensor.

In some implementations, transmitting the neural network output data for each of the multiple images and image data for a subset of the multiple images instead of image data of each of the multiple images includes transmitting the image data for a first image in the multiple images and the neural network output data for the first image, transmitting the neural network output data for a second image, and transmitting the image data for a third image in the multiples images and the neural network output data for the third image before and without transmission of the image data for the second image. For example, the image sensor 100 may transmit image data of frame A, then transmit neural network output data for frames A-I, then transmit image data for frame K, and then transmit neural network output data for frames J-T.

In some implementations, transmitting, from the image sensor, the neural network output data for each of the multiple images and image data for a subset of the multiple images instead of image data of each of the multiple images includes transmitting the image data of the subset of the multiple images at a particular number of frames per second and transmitting the neural network output data for the images while the image data for the subset of the multiple images is not being transmitted. For example, the image sensor 100 may transmit image data at ten frames per second where image data for each frame is transmitted for ten milliseconds, and transmit neural network output data for the other images during the remaining nine hundred milliseconds per second while the image data is not being transmitted.

In some implementations, transmitting the neural network output data and the image data includes transmitting the neural network output data and the image data to a central processing unit. For example, the image sensor 100 may transmit the image data for frame A and the neural network output data for frames A-I to a computer so that the computer may perform additional object detection using frame A and the neural network output data for frames A-I.

In some implementations, the process 800 includes analyzing the second image in the multiple images for object detection while transmitting the image data for the first image in the multiple images and the neural network output data for the first image. For example, the neural network circuitry groups 132 of the third integrated circuit layer 130 may detect objects in frame B while the neural network output data generated for frame A is being output from the image sensor 100.

In some implementations, the process 800 includes generating the neural network output data related to results of the analysis of the multiple images for object detection while capturing the third image. For example, the neural network circuitry groups 132 of the third integrated circuit layer 130 may generate neural network output data related to detect objects within frame B while the pixel groups in the first integrated circuit layer 110 are capturing frame C.

In some implementations, in process 800 the subset of the multiple images for which image data is transferred includes every Nth image captured by the image sensor, where N is an integer greater than one. For example, the subset of the multiple images may be every tenth image captured by the image sensor 100. In some implementations, in process 800 the image data for a particular image of the images includes data that indicates values for each pixel within the image. For example, the image data may be red-green-blue (RGB) intensity values for each pixel in the image.

In some implementations, in the process 800 the neural network output data for a particular image of the images includes one or more of selected regions of interest for pixels representing detections, metadata containing temporal and geometrical location information, intermediate computational results prior to object detection, statistical information regarding network certainty level, and classifications of detected objects. For example, the neural network output data for frame A may indicate that a human was detected at particular coordinates of frame A. In some implementations, in the process 800 the neural network output data for a particular image of the images represents partially processed data that is provided to a processor for further processing. For example, instead of representing detected objects, the neural network output data may represent partially processed data that is to be further processed outside of the image sensor 100 to detect objects.

Figure 9:
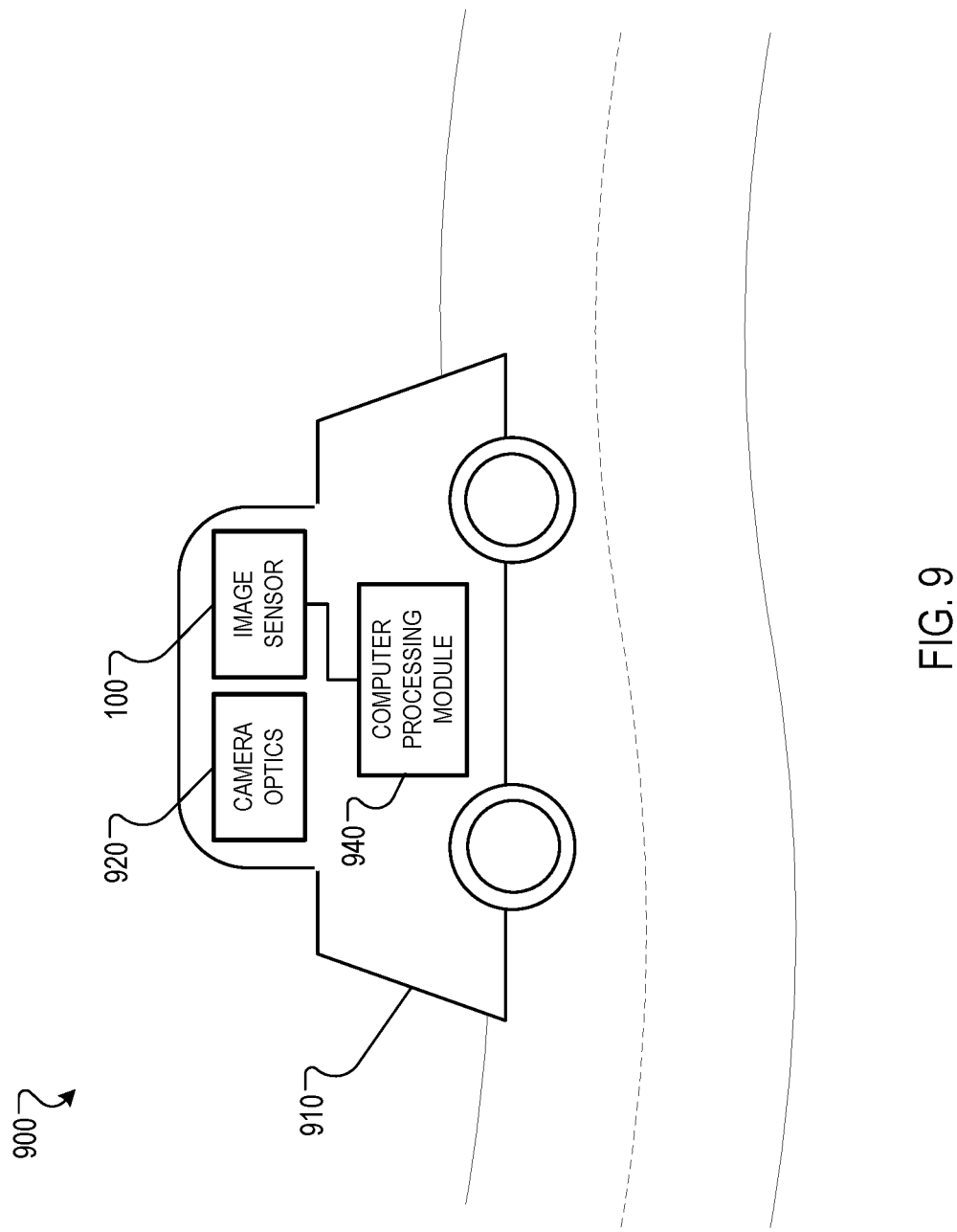
FIG. 9 is a block diagram of an example system that includes the image sensor used by an autonomous vehicle.

FIG. 9 is a block diagram of an example system 900 that includes the image sensor 100 used by an autonomous vehicle 910. The autonomous vehicle 910 may be a self-driving vehicle that captures images, detects objects in the images, and then drives based on the objects that the autonomous vehicle 910 detects. For example, the autonomous vehicle 910 may detect another vehicle moving in front of the autonomous vehicle 910 and keep pace directly behind that vehicle. In another example, the autonomous vehicle 910 may detect a human in front of the autonomous vehicle 910 and stop.

The autonomous vehicle 910 may include camera optics 920, the image sensor 100, and a computer processing module 940. The camera optics 920 may include lens that modify light. For example, the camera optics 920 may include a panoramic lens. The image sensor 100 may receive light modified by the camera optics 920 and capture images based on the light that falls on the image sensor 100.

The image sensor 100 may then transmit data to the computer processing module 940 across a data transmission cable that electrically couples the image sensor 100 and the computer processing module 940. For example, the image sensor 100 may capture a frame for ten milliseconds every one hundred milliseconds, and transmit, across the data transmission cable and to the computer processing module 940, image data for every tenth frame captured and neural network output data for all the frames captured by the image sensor 100. The computer processing module 940 may receive the image data and the neural network output data from the image sensor 100, optionally perform further object detection using the image data and the neural network output data, and determine how the autonomous vehicle 910 should move based on the objects that are detected.

Accordingly, using the image sensor 100 that performs at least some processing for object detection on the image sensor 100, the computer processing module 940 may determine how to move based images obtained every ten milliseconds whereas using another image sensor the computer processing module 940 may only determine how to move based on images obtained every one hundred milliseconds. Therefore, by using the image sensor 100 instead of another image sensor, the autonomous vehicle 940 may more quickly detect objects and move responsive to those objects.

Figure 10:
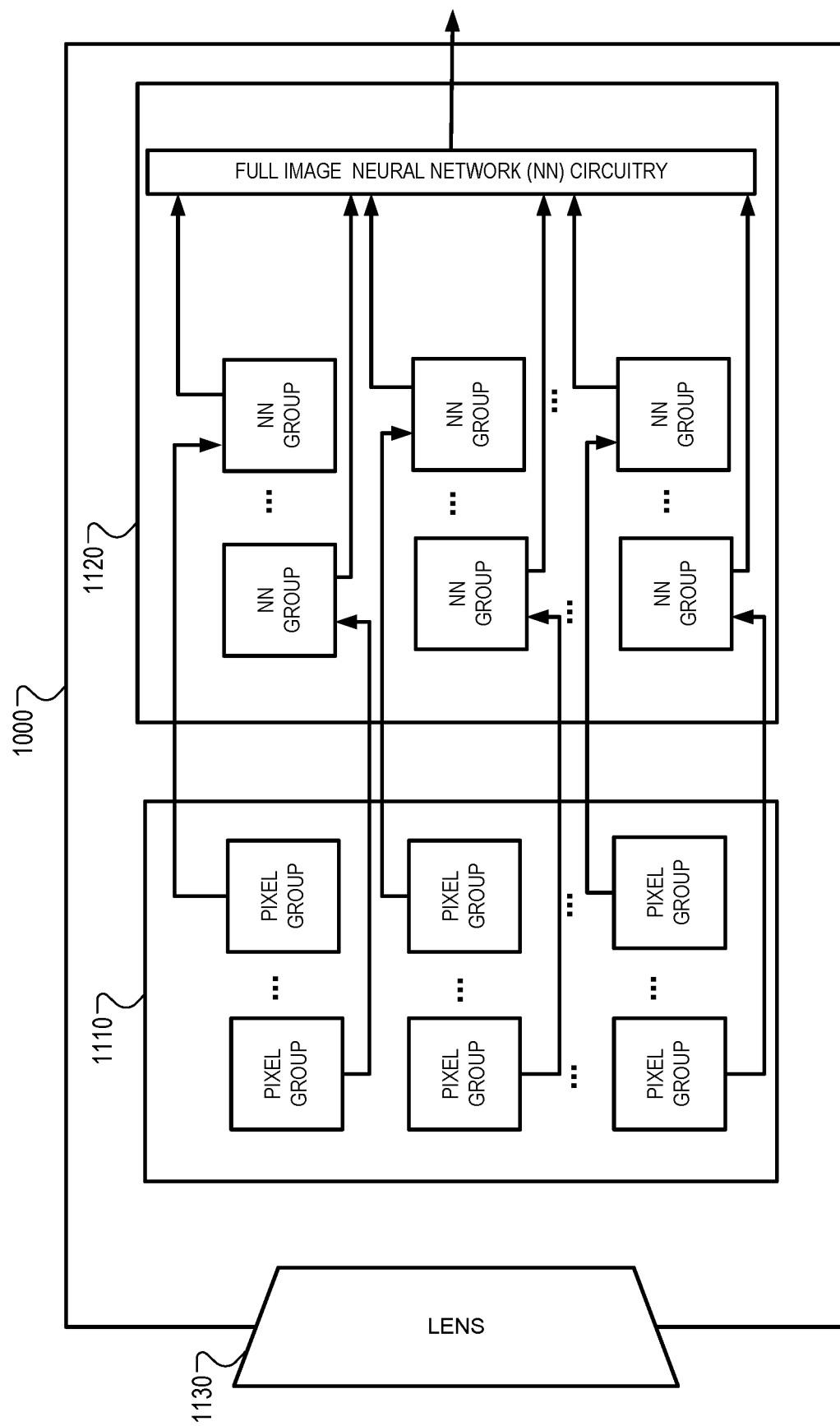
FIG. 10 is a block diagram of an example system that includes pixel sensor groups and neural network circuitry on separate chips.

FIG. 10 is a block diagram of an example system 1000 that includes pixel sensor groups and neural network circuitry on separate chips. The system 1000 may be a camera that includes a first chip 1110 that includes pixel sensor groups and a second chip that includes 1120 neural network circuitry. The pixel sensor groups and the neural network circuitry may be similar to those described above except that that they are not included in different layers within a single integrated chip, but are instead in the first chip 1110 and second chip 1120. For example, the first chip 1110 and the second chip 1120 may be positioned on top of each other in the system 1000 and connected by electrically conductive material so that data may be transferred between corresponding pixel sensor groups and neural network circuitry.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a user computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An image sensor comprising:
a first integrated circuit layer comprising pixel sensors that are grouped based on position in the first integrated circuit layer into pixel sensor groups;
a second integrated circuit layer in electrical communication with the first integrated circuit layer, the second integrated circuit layer comprising image processing circuitry groups that are physically coupled to corresponding pixel sensor groups by corresponding interconnects and that are configured to each receive pixel information from the corresponding pixel sensor group, each of the image processing circuitry groups further configured to perform image processing operations on the pixel information from the corresponding pixel sensor group to provide processed pixel information for the corresponding pixel sensor group during operation of the image sensor;
a third integrated circuit layer in electrical communication with the second integrated circuit layer, the third integrated circuit layer comprising neural network circuitry groups that are configured to each receive the processed pixel information from a corresponding image processing circuitry group, the neural network circuitry groups further configured to perform analysis for object detection on the processed pixel information for the corresponding pixel sensor groups during operation of the image sensor; and
circuitry that outputs information indicating results of the analysis for object detection by the neural network circuitry groups,
wherein the first integrated circuit layer is stacked on the second integrated circuit layer and the second integrated circuit layer is stacked on the third integrated circuit layer.

2. The image sensor of claim 1, wherein the results of the analysis for object detection include at least one of the group consisting of:
selected regions of interest for pixels representing detections;
metadata containing temporal and geometrical location information;
intermediate computational results prior to object detection;
statistical information regarding network certainty level; and
classifications of detected objects.

3. The image sensor of claim 1, wherein the neural network circuitry groups each include circuitry that is configured to implement a convolutional neural network.

4. The image sensor of claim 3, wherein the convolutional neural networks each detect objects sensed by the pixel sensor group that corresponds to the image processing circuitry group that corresponds to the neural network circuitry group.

5. The image sensor of claim 1, wherein the third integrated circuit layer includes circuitry that is configured to implement a recurrent neural network.

6. The image sensor of claim 5, wherein the recurrent neural network receives the information regarding the objects detected by all of the neural network circuitry groups and detects objects sensed across multiple ones of the pixel sensor groups.

7. The image sensor of claim 1, wherein each of the neural network circuitry groups is located directly beneath the image processing circuitry group that provides the processed pixel information to the neural network circuitry group.

8. The image sensor of claim 1, wherein each of the image processing circuitry groups is located directly beneath or in the immediate proximity of the pixel sensor group that provides the pixel information to the image processing circuitry group.

9. The image sensor of claim 1, wherein the first integrated circuit layer, the second integrated circuit layer, and the third integrated circuit layer are integrated in a single integrated chip.

10. The image sensor of claim 1, wherein each of the pixel sensor groups comprise a same number of pixel sensors.

11. The image sensor of claim 1, wherein each of the image processing circuitry groups perform high dynamic range fusion on the pixel information from the corresponding pixel sensor group.

12. The image sensor of claim 1, wherein each of the image processing circuitry groups includes an analog digital converter.

13. The image sensor of claim 1, wherein a first image processing circuitry group of the image processing circuitry groups receives pixel information from a first pixel sensor group in the first integrated circuit layer and does not receive pixel information from any other pixel sensor group in the first integrated circuit layer.

14. The image sensor of claim 1, wherein a first neural network circuitry group of the neural network circuitry groups receives processed pixel information from a first image processing circuitry group in the second integrated circuit layer and does not receive processed pixel information from any other image processing circuitry group in the second integrated circuit layer.

15. The image sensor of claim 1, wherein the image processing circuitry groups receive the pixel information in parallel from the pixel sensor groups through the corresponding interconnects.

* * * * *